United States Patent
Sakui

(10) Patent No.: US 9,934,868 B2
(45) Date of Patent: Apr. 3, 2018

(54) METHODS AND APPARATUSES HAVING STRINGS OF MEMORY CELLS AND SELECT GATES WITH DOUBLE GATES

(71) Applicant: Micron Technology, Inc., Boise, ID (US)

(72) Inventor: Koji Sakui, Setagayaku (JP)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 15/362,435

(22) Filed: Nov. 28, 2016

(65) Prior Publication Data

US 2017/0076808 A1    Mar. 16, 2017

Related U.S. Application Data

(62) Division of application No. 14/031,509, filed on Sep. 19, 2013, now Pat. No. 9,508,735.

(51) Int. Cl.

| | |
|---|---|
| G11C 16/34 | (2006.01) |
| G11C 16/26 | (2006.01) |
| H01L 27/11524 | (2017.01) |
| H01L 27/11556 | (2017.01) |
| H01L 27/1157 | (2017.01) |
| H01L 27/11582 | (2017.01) |
| G11C 16/04 | (2006.01) |
| G11C 16/10 | (2006.01) |

(52) U.S. Cl.
CPC ...... *G11C 16/3427* (2013.01); *G11C 16/0483* (2013.01); *G11C 16/10* (2013.01); *G11C 16/26* (2013.01); *H01L 27/1157* (2013.01); *H01L 27/11524* (2013.01); *H01L 27/11556* (2013.01); *H01L 27/11582* (2013.01)

(58) Field of Classification Search
CPC ..... G11C 16/26; G11C 16/10; G11C 16/0483; G11C 16/3247; G11C 16/3427; H01L 27/11524; H01L 27/11556; H01L 27/1157; H01L 27/11582
See application file for complete search history.

(56) References Cited

U.S. PATENT DOCUMENTS

| | | | | |
|---|---|---|---|---|
| 7,339,821 B2* | 3/2008 | Walker | ............. | G11C 16/10 365/185.02 |
| 7,402,850 B2* | 7/2008 | Bhattacharyya | ....... | B82Y 10/00 257/239 |
| 7,636,256 B2* | 12/2009 | Gomikawa | .......... | H01L 27/115 257/315 |

(Continued)

OTHER PUBLICATIONS

Fried, David M., et al., "Improved independent gate N-type FinFET fabrication and characterization", IEEE Electron Device Letters, vol. 24, No. 9, (Sep. 2003), 592-594.

(Continued)

*Primary Examiner* — Vanthu Nguyen
(74) *Attorney, Agent, or Firm* — Schwegman Lundberg & Woessner, P.A.

(57) ABSTRACT

An apparatus, a method, and a system are disclosed. The apparatus includes a string of memory cells coupled to a select gate drain transistor that has a front control gate and a back control gate. The front and back control gates can be coupled together such that they are biased at the same voltage or separate such that they can be biased at different voltages.

16 Claims, 13 Drawing Sheets

(56) References Cited

U.S. PATENT DOCUMENTS

| | | | |
|---|---|---|---|
| 8,320,182 B2 * | 11/2012 | Kirisawa | G11C 16/0483 257/324 |
| 8,335,111 B2 * | 12/2012 | Fukuzumi | G11C 16/0483 257/324 |
| 9,076,544 B2 * | 7/2015 | Mokhlesi | G11C 11/5642 |
| 9,508,735 B2 | 11/2016 | Sakui | |
| 9,536,611 B2 * | 1/2017 | Shih | G11C 16/10 |
| 2007/0252201 A1 * | 11/2007 | Kito | H01L 21/8221 257/331 |
| 2009/0279361 A1 * | 11/2009 | Lojek | G11C 16/0433 365/185.18 |
| 2015/0078089 A1 | 3/2015 | Sakui | |

OTHER PUBLICATIONS

Fukuzumi, Yoshiaki, et al., "Optimal Integration and Characteristics of Vertical Array Devices for Ultra-High Density, Bit-Cost Scalable Flash Memory", Electron Devices Meeting. IEDM IEEE International, (2007), 449-452.

Kuriyama, Hirotada, "A C-switch cell for low-voltage and high-density SRAMs", IEEE Transactions on Electron Devices vol. 45, Issue: 12, (1988), 2483-2488.

Masahara, Meishoku, et al., "Demonstration, analysis, and device design considerations for independent DG MOSFETs", IEEE Transactions on Electron Devices vol. 52, Issue: 9, (2005), 2046-2053.

Wang, Hongmei, et al., "Super thin-film transistor with SOI CMOS performance formed by a novel grain enhancement method", IEEE Transaction on Electron Devices, vol. 47, No. 8, (2000), 1580-1586.

\* cited by examiner

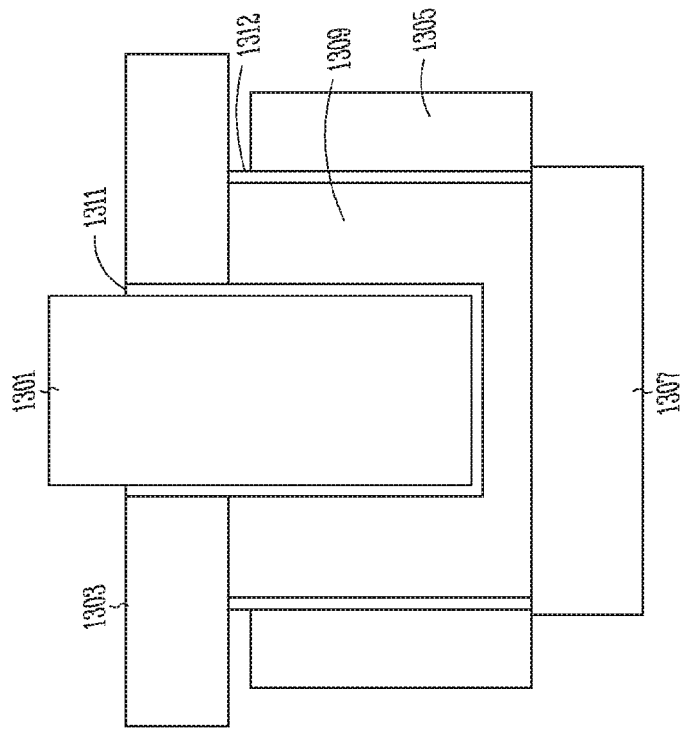
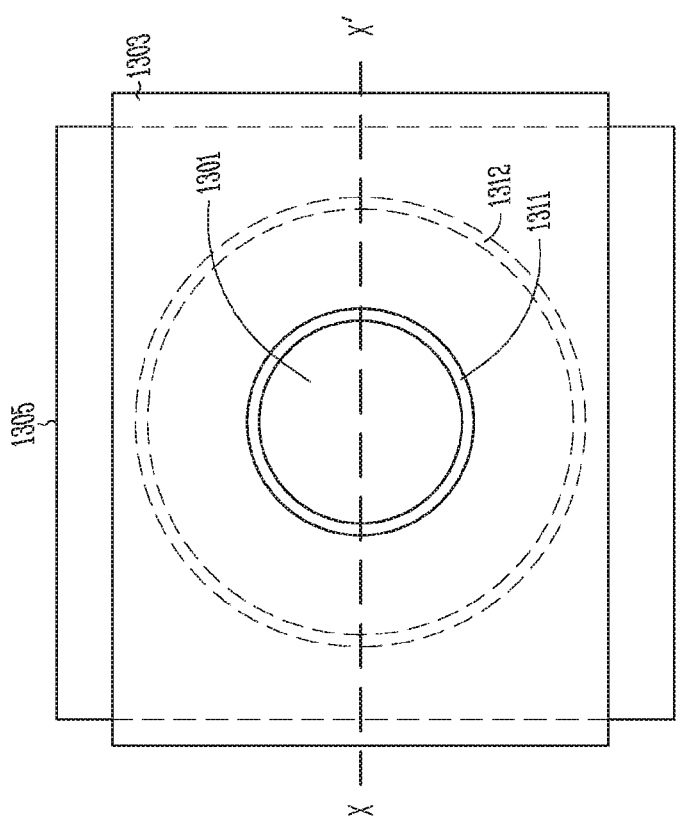

METHODS AND APPARATUSES HAVING STRINGS OF MEMORY CELLS AND SELECT GATES WITH DOUBLE GATES

PRIORITY APPLICATION

This application is a divisional of U.S. application Ser. No. 14/031,509, filed Sep. 19, 2013, now issued as U.S. Pat. No. 9,508,735, which is incorporated herein by reference in its entirety.

TECHNICAL FIELD

The present embodiments relate generally to memory and double gated select gates in memory.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and non-volatile flash) memory.

Flash memory devices typically use a one-transistor memory cell that may allow for high memory densities, high reliability, and low power consumption. Changes in threshold voltage of the memory cells, through programming of a charge storage structure such as floating gates, trapping layers or other physical phenomena, may determine the data state of each cell.

The memory cells may be arranged in strings of memory cells where each string may be coupled to a source. Groups of strings of memory cells (e.g., memory blocks) may all be coupled to a common source.

FIG. 1 illustrates a schematic diagram of a typical string 100 of memory cells. The string 100 can include a source select gate transistor 120 that may include an n-channel transistor coupled between one of the memory cells 112 at one end of the string 100 and a common source 126. The common source 126 may comprise, for example, a commonly doped semiconductor material and/or other conductive material. At the other end of the string 100, a drain select gate transistor 130 may include an n-channel transistor coupled between one of the memory cells 112 and a data line (e.g., bit line) 134.

Each of the memory cells 112 may comprise, for example, a floating gate transistor or, alternatively, a charge trap transistor and may include a single level charge storage device or a multilevel charge storage device. The memory cells 112, the source select gate transistor 120, and the drain select gate transistor 130 can be controlled by signals on their respective control gates, the signals being provided on access lines (e.g., word lines) WL0-WL15 and select lines SOS and SOD. In one embodiment, the control gates of memory cells in a row of memory cells can form part of an access line.

The source select gate transistor 120 receives a control signal SGS that controls the source select gate transistor 120 to substantially control conduction between the string 100 and the common source 126. The drain select gate transistor 130 receives a control signal SOD that controls the drain select gate transistor 130, so that the drain select gate transistor 130 can be used to select or deselect the string 100.

The string 100 can be one of multiple strings of memory cells 112 in a block of memory cells in a memory device, such as a NAND-architecture flash memory device. Each string 100 of memory cells 112 may be formed in a three-dimensional (3D) manner such that the memory cells 112 and select gate transistors 120, 130 at least partially encircle a semiconductor channel.

As memory manufacturers move from a typical two dimensional (2D) NAND structure to a 3D NAND structure, at least the select gate drain transistors have shown a tendency towards greater current leakage. The bodies of select gate drain transistors of the 3D NAND are typically made of a polysilicon and have a tendency towards greater current leakage than the 2D NAND select gate transistors, the bodies of which are typically made of single crystal silicon.

Current leakage through the select gate drain transistors can cause problems with both programming and reading operations of the memory cells of a 3D NAND device. For example, during a program or read operation, electrons can penetrate into the channels of the unselected memory cell strings. Since a number of control gates of strings of memory cells can be connected in a row, the program or read voltage used to bias a control gate of a selected memory cell may be connected to the control gates of a number of unselected memory cells. Thus, even though the data line is typically inhibited to the unselected memory cell strings, any select gate drain current leakage may cause some of the unselected memory cells to be inadvertently programmed or a selected memory cell being read to be read incorrectly.

BRIEF DESCRIPTION OF THE DRAWINGS

FIGS. 13A and 13B illustrate a top view and a cross-sectional view, respectively, of an embodiment of a double surround gate transistor.

DETAILED DESCRIPTION

Figure 1:
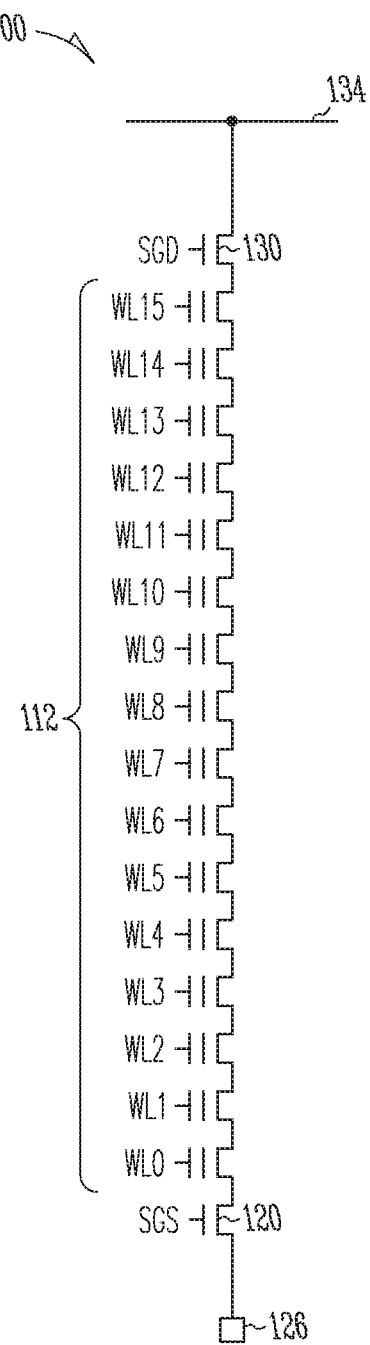
FIG. 1 illustrates a schematic diagram of an embodiment of a typical memory cell string.

In the following detailed description, reference is made to the accompanying drawings that form a part hereof and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

Subsequent embodiments may refer to a NAND architecture in reference to the memory cell strings, memory arrays, and memory devices. The NAND structure is for purposes of illustration only as the present embodiments may not be limited to any one particular memory architecture.

Figure 2:
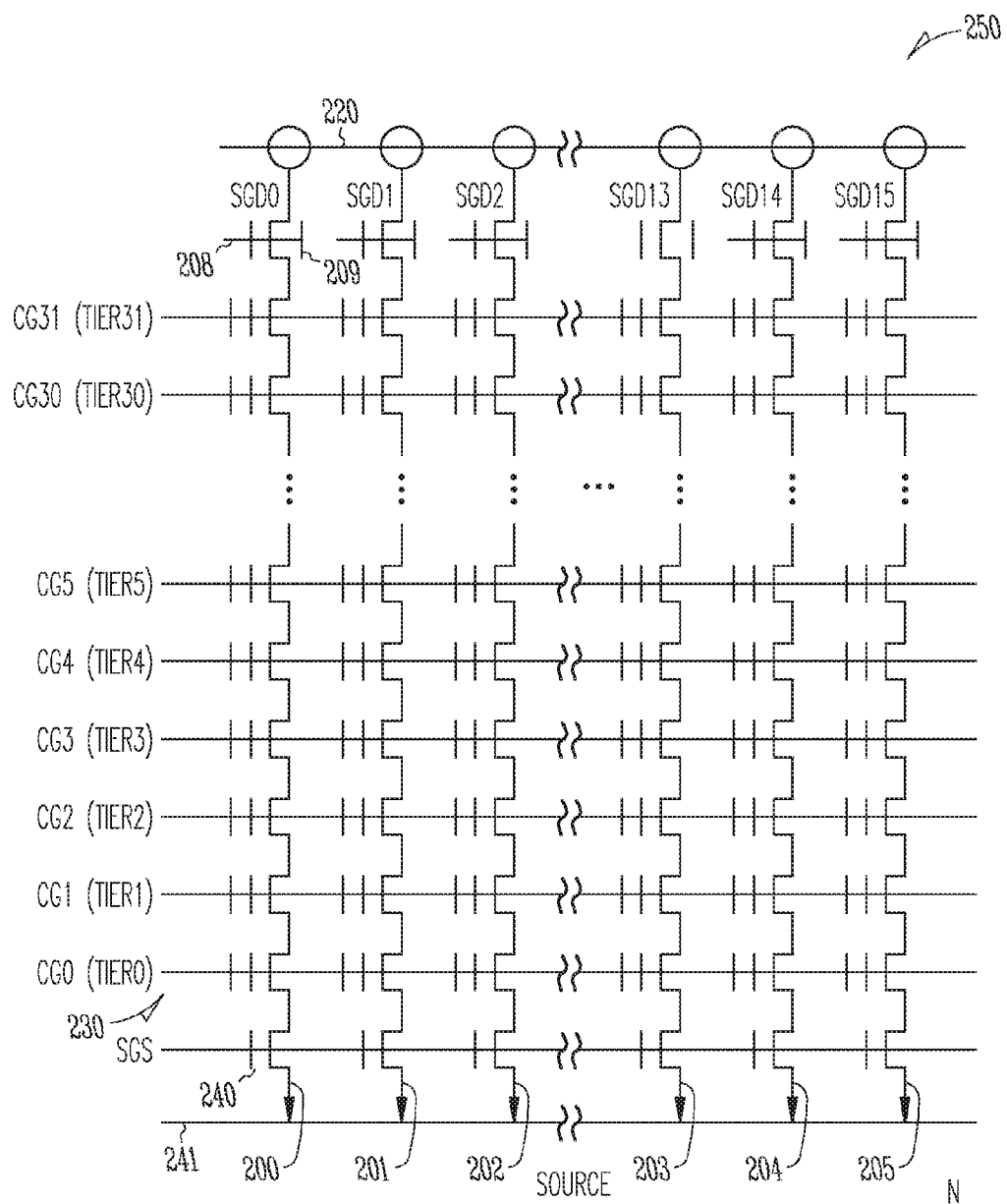
FIG. 2 illustrates a schematic diagram of an embodiment of a group of memory cell strings incorporating double gate select gate drain transistors.

FIG. 2 illustrates a schematic diagram of an embodiment of a group of memory cell strings 250 incorporating double gate select gate drain transistors. The group 250 of FIG. 2 represents sixteen memory cell strings 200-205 for purposes of illustration only. Other embodiments can have different numbers of memory cell strings 200-205.

The memory cell strings 200-205 can each include a plurality of memory cells 230. The memory cell strings 200-205 of FIG. 2 represent 32 memory cells in each memory cell string 200-205. This is for purposes of illustration only as the present embodiments are not limited to any one particular number of memory cells in a memory cell string 200-205.

The control gates CG0-CG31 of the 32 memory cells 230 in each memory cell string 200-205 can be coupled to the respective control gates of the other memory cell strings 200-205 of the group of memory cells 250 in order to form one or more rows of memory cells, As will be shown and discussed subsequently, each row of memory cells can be included in a tier (e.g., Tier0-Tier31) due to the manner in which they are formed vertically as tiers of control gate material as part of a 3D NAND structure, A tier may include memory cells from different memory cell strings in which the memory cells are located in the same level of the device.

Each memory cell string 200-205 can be coupled to a source 241 through a respective select gate source transistor 240. A control gate of each select gate source transistor 240 of each memory cell string 200-205 can be coupled together such that an enabling voltage on one control gate can enable the select gate source transistors 240 of all of the memory cell strings 200-205 of the group of memory cells 250.

The memory cell strings 200-205 each incorporate a select gate drain transistor SGD0-SGD15 having a double control gate 208, 209. Each select gate drain transistor SGD0-SGD15 can be coupled between the upper-most row of memory cells (e.g., Tier 31) and the data line 220. The control gates 208, 209 of each of the select gate drain transistors SGD0-SGD15 may not be connected such that they can be biased separately. In other words, enabling a first select gate drain transistor SGD0 enables current to flow between the data line 220 and the first memory cell string 200. The remaining select gate drain transistors SGD1-SGD15 can remain unselected so that their respective memory cell strings 201-205 can remain isolated from the data line 220.

The double gates of each select gate drain transistor SGD0-SGD15 can be referred to as a front control gate 208 and a back control gate 209. When both of these control gates 208, 209 are properly biased, their respective select gate drain transistor SGD0 can be enabled (e.g., selected). The back control gate 209 can act as a bias "assist" so that the conductance of a selected select gate drain transistor SGD0 can become large during a read or program operation. Thus, the leakage current through the unselected select gate drain transistors SGD1-SGD15 can be reduced.

In an embodiment, the front control gate 208 and back control gate 209 of a given select gate drain transistor may be biased as one control gate. In such an embodiment, the control gates 208, 209 may be physically connected together or just biased with substantially the same voltage. In another embodiment, the control gates 208, 209 of a given select gate drain transistor may be biased separately with different voltages.

For example, the back control gate 209 may be separately controlled from the front control gate 208 by biasing the back control gate 209 with a negative voltage while biasing the front control gate 208 with another voltage (e.g., 0V). This may further suppress the leakage current, during a program or read operation, as compared to biasing the control gates 208, 209 together. During an erase operation, both the front control gate 208 and the back control gate 209 can be biased with the same voltage. The front control gate and the back control gate can control access of the string of memory cells to a data line (e.g., bit line).

Figure 3:
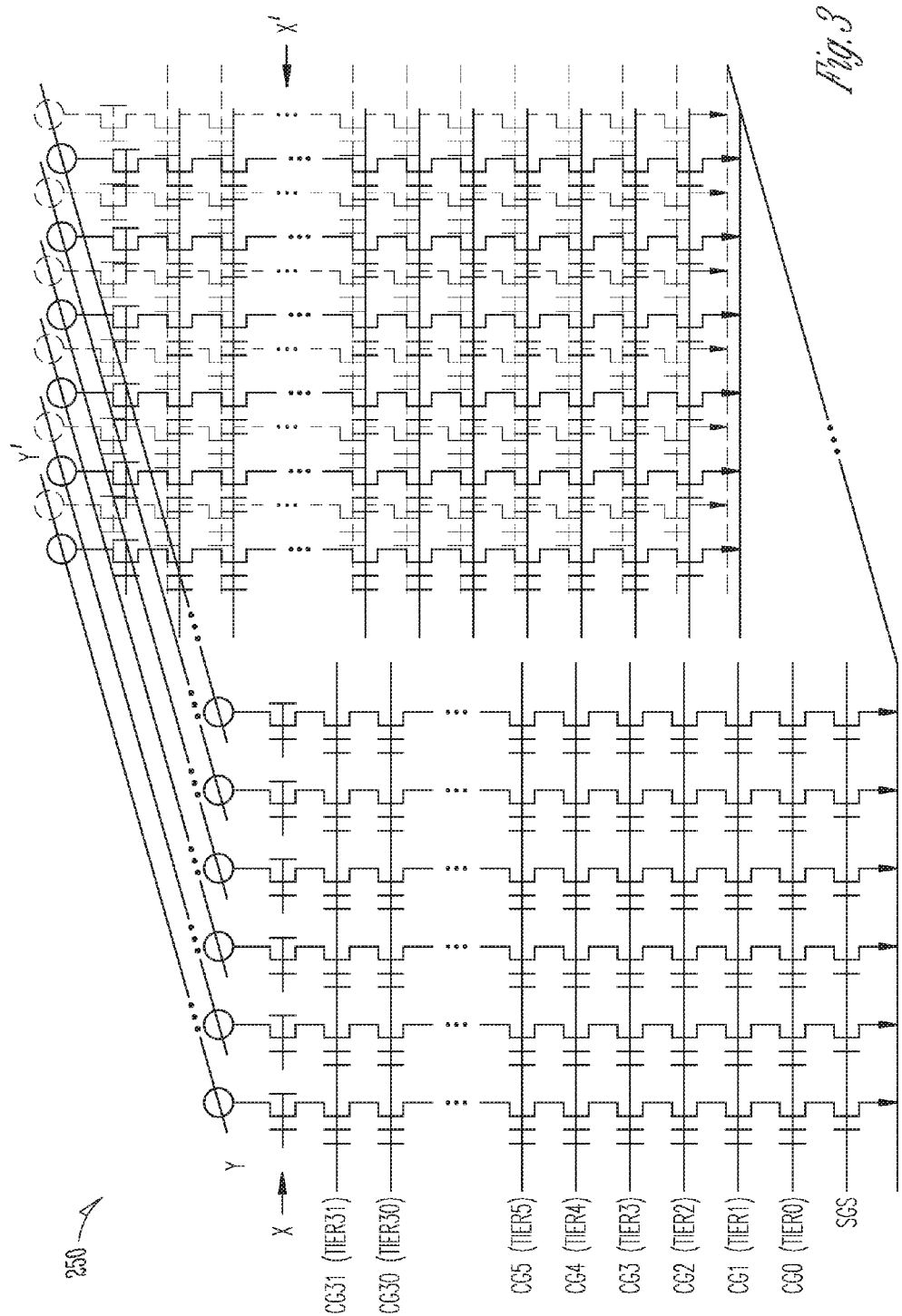
FIG. 3 illustrates a three-dimensional schematic diagram of an embodiment of an array of memory cell strings in accordance with the embodiment of FIG. 2.

FIG. 3 illustrates a three-dimensional schematic diagram of an embodiment of a memory array architecture in accordance with the embodiment of FIG. 2. The schematic diagram shows a representation of the group of memory cell strings 250 as shown in FIG. 2 and described previously. The group of memory cell strings 250 are shown in FIG. 3 as extending along an X-X' axis. To form the memory array illustrated in FIG. 3, a plurality of groups of memory cell strings 250 may extend into the page along a Y-Y' axis. The illustrated memory cell strings may be realized in 3D pillars of memory cells, as described subsequently, that can employ surround gate transistors (SGT) as both the memory cells and the select gate transistors (e.g., SGD and SGS). The SGD transistors can be referred to as double SGT (DSGT) and can be fabricated with a polysilicon or a bulk silicon body.

Figure 4:
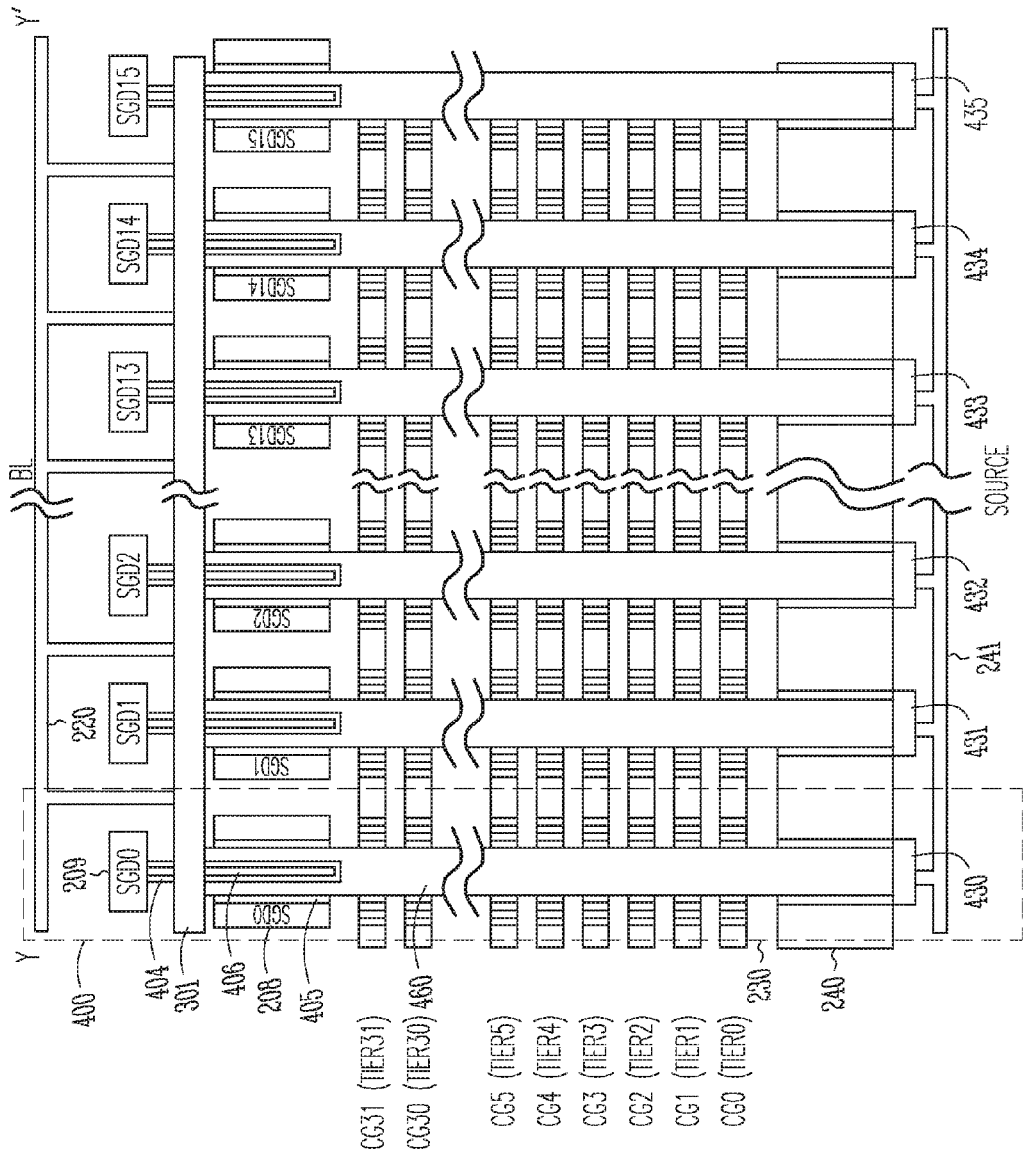
FIG. 4 illustrates a cross sectional view along a Y-Y' axis of an embodiment of the group of 3D memory cell pillars incorporating double gate select drain transistors in accordance with the embodiment of FIG. 3.

FIG. 4 illustrates a cross-sectional view of an embodiment of 3D pillars of memory cells 430-435 along the Y-Y' axis, as illustrated in FIG. 3. The pillars of memory cells 430-435 can represent 16 pillars of memory cells 430-435.

The pillars of memory cells 430-435 include a plurality of memory cells 230, as illustrated in FIG. 2, that can represent 32 memory cells. The memory cells 230 can be formed in tiers TIER0-TIER31 around each semiconductor pillar 460 (e.g., p-type polysilicon). The pillar 460 can act as a channel for the memory cells 230 during memory operation.

Select gate source transistors 240, implemented as SGT, can be formed at the bottom of each of the pillars of memory cells 430-435. The select gate source transistors 240 are coupled between a source 241 and the plurality of memory cells 230.

Select gate drain transistors SGD0-SGD15 can be formed at the tops of the pillars of memory cells 430-435. The select gate drain transistors SGD0-SGD15 can be double gate SGT. The select gate drain transistors SGD0-SGD15 can be formed around their respective pillar 460 with a front control gate dielectric 405 (e.g., oxide) formed between the pillar 460 and the front control gate material 208 (e.g., polysilicon). The back control gate material 209 (e.g., polysilicon) can be fitted over the pillar 460 with a back control gate extension 406 into the pillar 460 such that the extension 406 is substantially encircled by the pillar. A back control gate dielectric 404 (e.g., oxide) can be formed around the back control gate extension 406 and between the back control gate extension 406 and the pillar 460.

The data line 220 can extend across the pillars of memory cells 430-435 and eventually be coupled to sense circuitry (not shown). The data line 220 may also be coupled to a drain material 301 (e.g., of polysilicon) that can be formed over the pillars of memory cells 430-435 and substantially encircling the back control gate extension 406. The back control gate dielectric 404 can be formed around the back control gate extension 406 such that the back control gate dielectric 404 is between the back control gate extension 406 and the drain material 301. When both the front control gate material 208 and the back control gate material 209 of the select gate drain transistors SGD0-SGD15 are biased with enable voltages, the drain material 301 can be electrically coupled to the pillar 460 to enable current to flow between the data line 220 and the pillar 460. The back control gates of each of the plurality of strings of memory cells can be coupled together.

As previously discussed, this cross-sectional view represents the Y-Y' axis, as seen in FIG. 3. The X-X' axis, as seen in FIG. 3, can extend into the page. Thus, the area of components for two pillars 400 can extend into the page by two pillars, as represented in FIG. 5.

Figure 5:
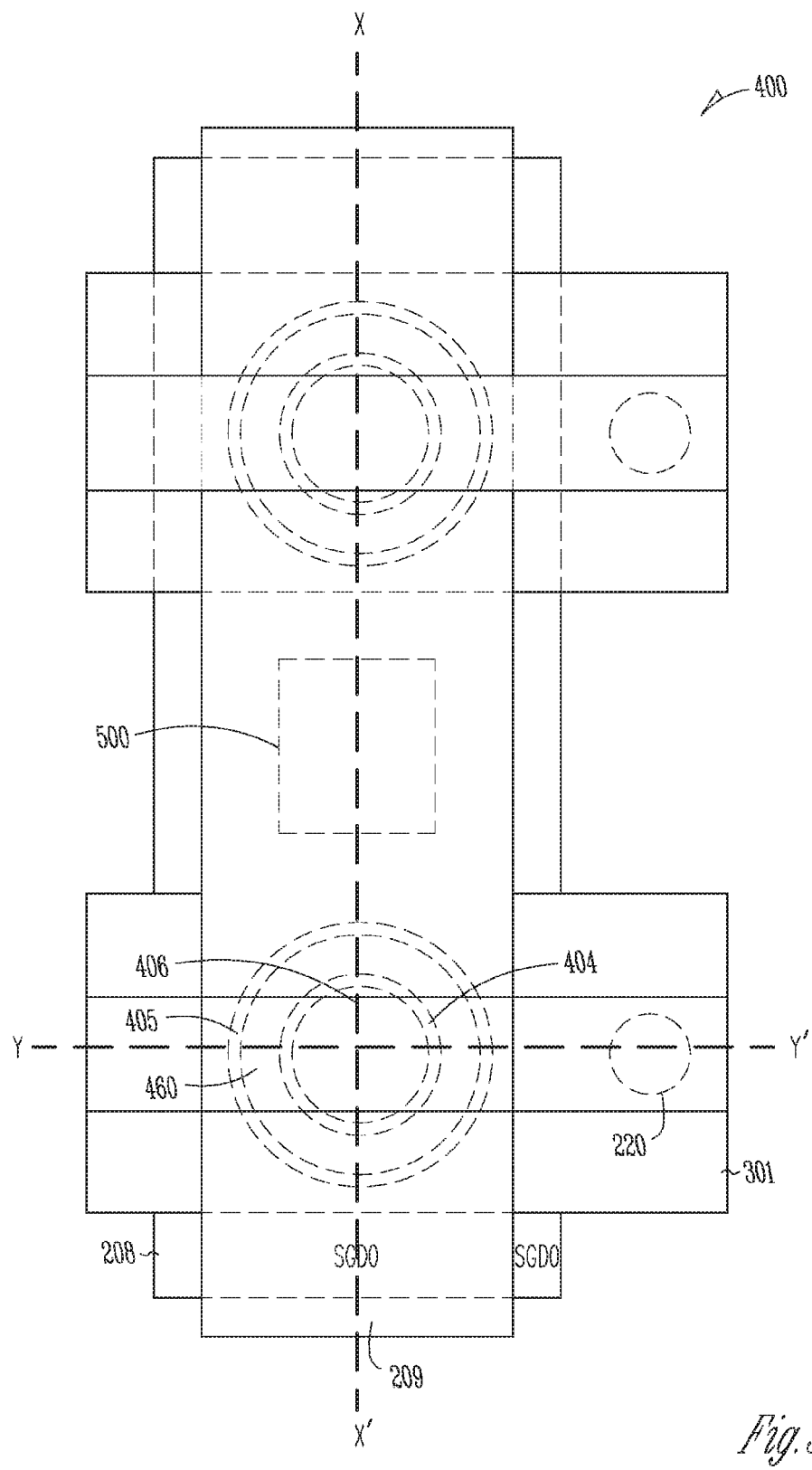
FIG. 5 illustrates a top view of an embodiment of a pair of memory cell pillars in accordance with the embodiment of FIG. 4.

FIG. 5 illustrates a top view of the area of components for two pillars 400 as seen in FIG. 4. The reference numbers used in FIG. 4 are applied to like components illustrated in FIG. 5.

FIG. 5 shows the select gate drain transistor SGD0. Select gate drain transistor SGD0 includes the front control gate material 208 and the back control gate material 209. The front control gate material 208 and the back control gate material extend along the X-X' axis such that the SGD0 transistors of strings of memory cells in front of and behind the illustrated SGD0 area all connected.

The back control gate extension 406 is shown surrounded by the back control gate dielectric 404. A portion of the pillar 460 is also shown surrounded by the front control gate dielectric 405 that is between the front control gate material 208 and the pillar 460.

Figure 6:
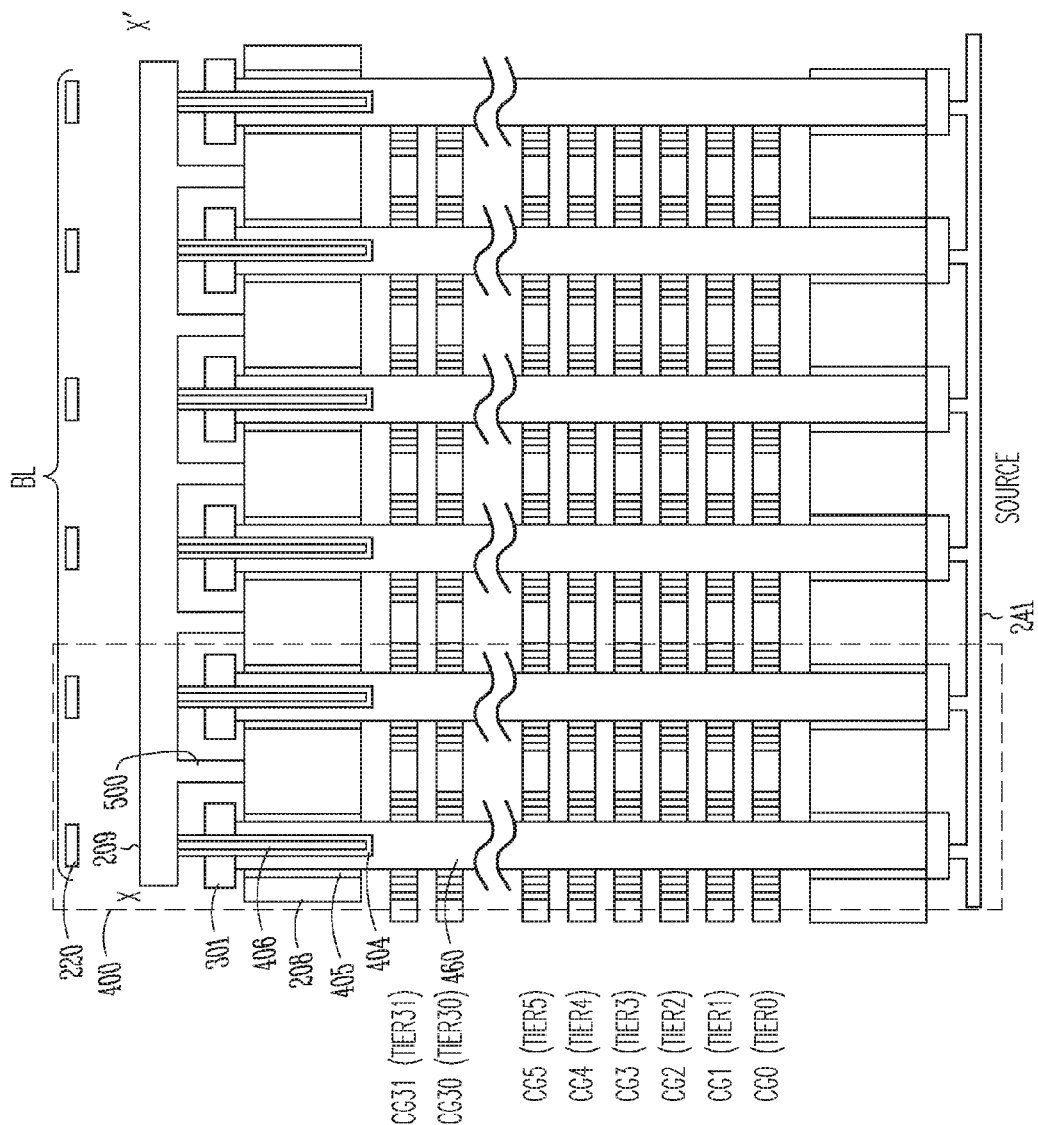
FIG. 6 illustrates a cross-sectional view along an X-X' axis of the group of 3D memory cell pillars in accordance with the embodiment of FIGS. 3 and 4.

The overlying data line 220 is shown coupled to the drain material 301 that extends along the Y-Y' axis. In one embodiment, a shunt material 500 is shown as part of the back control gate material 209. As seen in FIG. 6 and discuss subsequently, the shunt material 500 can be used to connect the back control gate material 209 to the front control gate material 208 so that both the front control gate and the back control gate can be biased as a single gate. Thus, any voltage applied to either gate will also bias the other gate.

As discussed previously, another embodiment may not connect the back control gate material 209 to the front control gate material 208 such that the shunt material 500 may be omitted. In such an embodiment, the front control gate 208 and the back control gate 209 can be biased separately such that a voltage on one gate will not affect the voltage on the other control gate.

FIG. 6 illustrates a cross-sectional view of the embodiment of 3D pillars of memory cells of FIGS. 2-4 extending along the X-X' axis, as illustrated in FIG. 3.

This figure shows the overlying back control gate material 209 with the shunt material 500 extending between the back control gate material 209 and the front control gate material 208. As previously discussed, this shunt material 500 may be omitted for proper operation of the present embodiments.

FIG. 6 further shows the data line 220 and the drain material 301 extending into the page along the Y-Y' axis. The area 400 is shown substantially surrounding the two pillars as shown in FIG. 5.

The other elements of the select gate drain transistor SGD0 are also shown in FIG. 6. The back control gate extension 406 is shown extending down into the pillar 460 while surrounded by the back control gate dielectric 404. The front control gate material 208 is shown substantially surrounding a portion of the pillar 460 with the front control gate dielectric 405 between the front control gate material 208 and the portion of the pillar 460.

Figure 7:
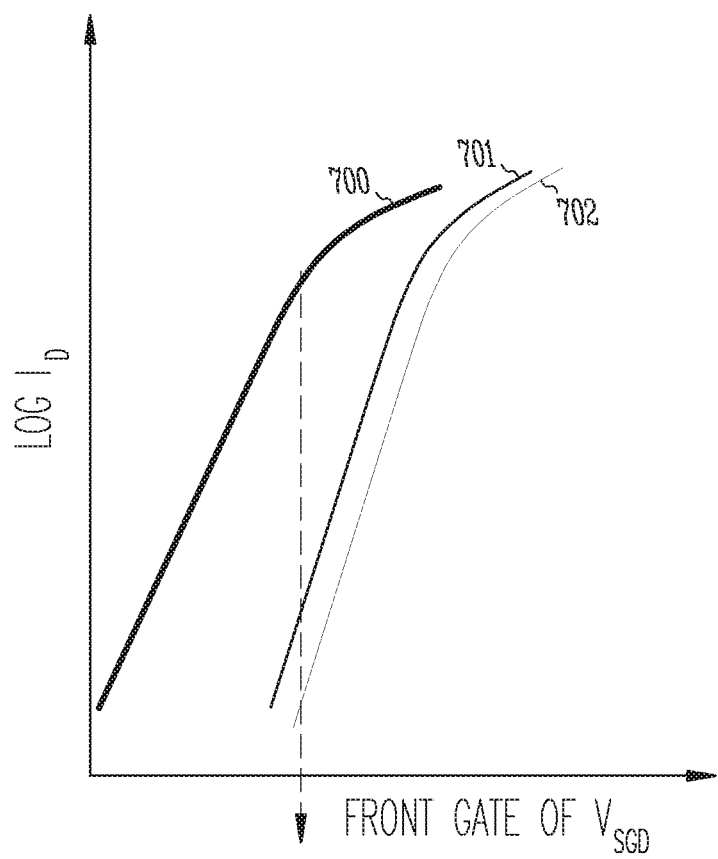
FIG. 7 illustrates sub-threshold characteristics of front control gate voltage versus drain leakage current for different embodiments in accordance with the embodiments of FIGS. 2-6.

FIG. 7 illustrates sub-threshold characteristics of front control gate voltage $V_{SGD}$ for a double gated select gate drain transistor versus drain current for the double gated select gate drain transistor for different embodiments in accordance with the embodiments of FIGS. 2-6. These plots are for purposes of illustration only as different voltages for the different embodiments may result in different plots.

The first plot 700 shows an embodiment where the back control gate of the select gate drain transistor is not connected to and is, thus, biased separately from the front gate. In this embodiment, the back control gate is biased at a supply voltage ($V_{CC}$). The second plot 701 shows an embodiment where the back control gate and the front control gate are coupled (e.g., shunted) together such that any voltage on either the front or back control gate will also bias the other gate at that voltage. The third plot 702 shows an embodiment where the back control gate is not connected to the front control gate and the back control gate is biased at 0V. This embodiment can also suppress the leakage current further by increasing the select gate drain transistor threshold voltage with a high p-type channel impurity concentration.

The plots of FIG. 7 show that, for a given front control gate voltage $V_{SGD}$, the leakage current ID is smallest where the front and back control gates are not connected (e.g., separate) and the back control gate is separately biased at 0V. In such an embodiment, the back control gate increases the select gat drain transistor's conductance in order to reduce the leakage current.

Figure 8:
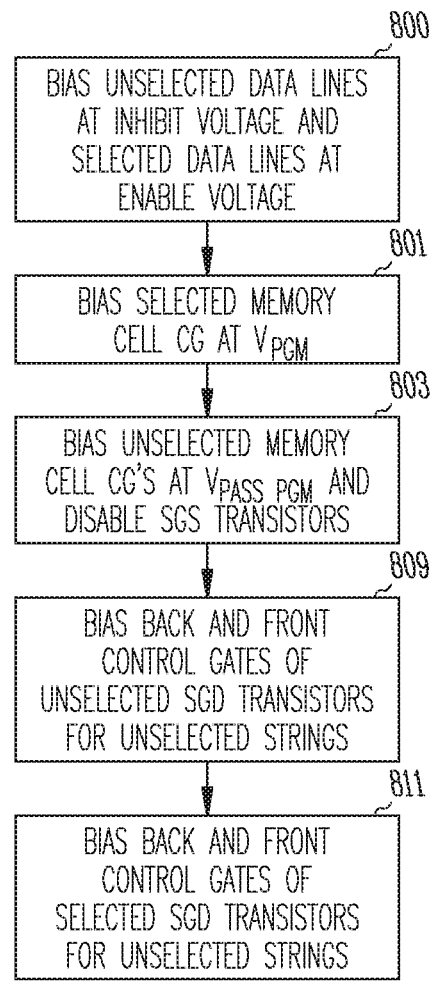
FIG. 8 illustrates a flow chart of an embodiment of a method for programming a memory cell.
Figure 11:
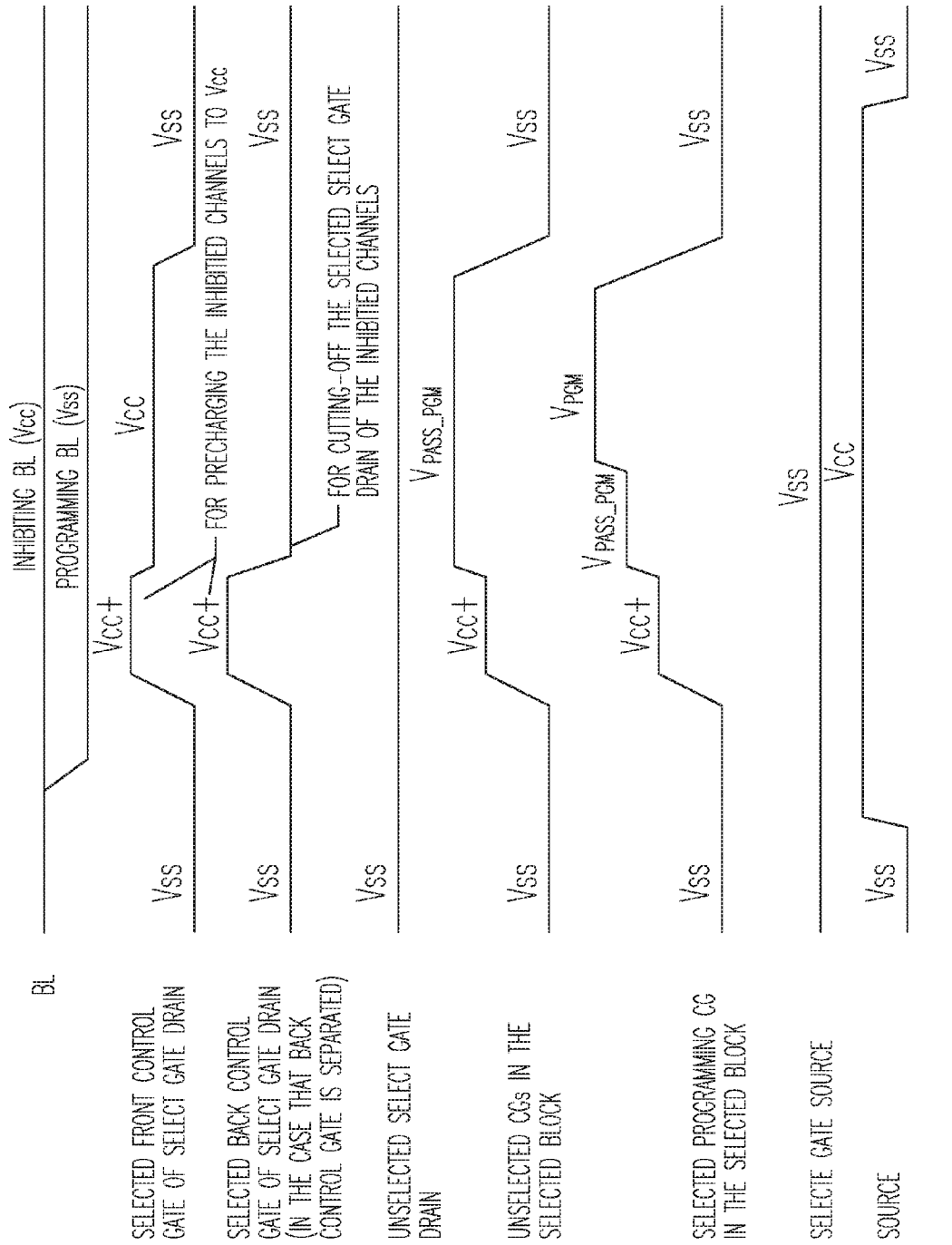
FIG. 11 illustrates a timing diagram of a method for programming the memory cell in accordance with the method of FIG. 8.

FIG. 8 illustrates a flow chart of an embodiment of a method for programming a memory cell. FIG. 11 illustrates an embodiment of a timing diagram of the method for programming. FIG. 8 illustrates steps that can be performed during a programming operation and, unless particularly noted, does not necessarily illustrate any particular order of steps since FIG. 11 illustrates the actual timing of the signals.

During the programming, unselected strings of memory cells can be program inhibited while the selected string of memory cells can be program enabled. Program inhibiting the unselected strings of memory cells may be accomplished by biasing a data line coupled to the unselected string of memory cells with a program inhibit voltage (e.g., $V_{CC}$) 800. Program enabling the selected string of memory cells can be accomplished by biasing a data line coupled to the selected string of memory cells with an enable voltage (e.g., 0V) 800.

A selected memory cell control gate is one of CG0-CG31. For example, when CG5 is selected, CG5 is biased with a programming voltage $V_{PGM}$ 801 (e.g., 15-20V). The other unselected memory cell control gates CG0-CG4 and CG6-CG31 can be biased at a program pass voltage $V_{PASS\_PGM}$ 803 (e.g., 7-12V). The select gate source (SGS) transistors can be disabled 803 by biasing their control gates at 0V while the source can be biased at some voltage greater than 0V (e.g., $V_{CC}$).

In an embodiment where the front control gate and the back control gate of the select gate drain transistors are coupled (e.g., shunted), the unselected select gate drain transistor control gates can be biased 809 at a disable voltage (e.g., 0V). The selected select gate drain transistor control gates can be biased 811 at an enable voltage (e.g., $V_{CC}$, 3V).

In an embodiment where the front control gate and the back control gate of the select gate drain transistors are biased separately (e.g., not shunted, not coupled), the front control gate of the unselected select gate drain transistors can be biased at a disable voltage (e.g., 0V) while the back control gate of the unselected select gate drain transistors can be biased at the same disable voltage (e.g., 0V) or at some other disable voltage (e.g., a negative voltage 809. The front control gate of the selected select gate drain transistors can be biased at an enable voltage (e.g., $V_{CC}$) while the back control gate of the selected select gate drain transistors can be biased at the same enable voltage (e.g., $V_{CC}$) or at some other enable voltage that operates the select gate drain transistor in a cut-off region of operation 811. For example, during the initial pre-charging the channel, the front control gate of the selected select gate drain transistors can be biased at an enable voltage (e.g., $V_{CC}$) while the back control gate of the selected select gate drain transistors can be biased at the same enable voltage (e.g., $V_{CC}$). But when the actual programming is activated by applying the high-voltages to the control gates, the select gate drain transistors of the inhibited channels are in a cut-off region operation by applying 0V to the back control gate of the selected select gate.

Figure 9:
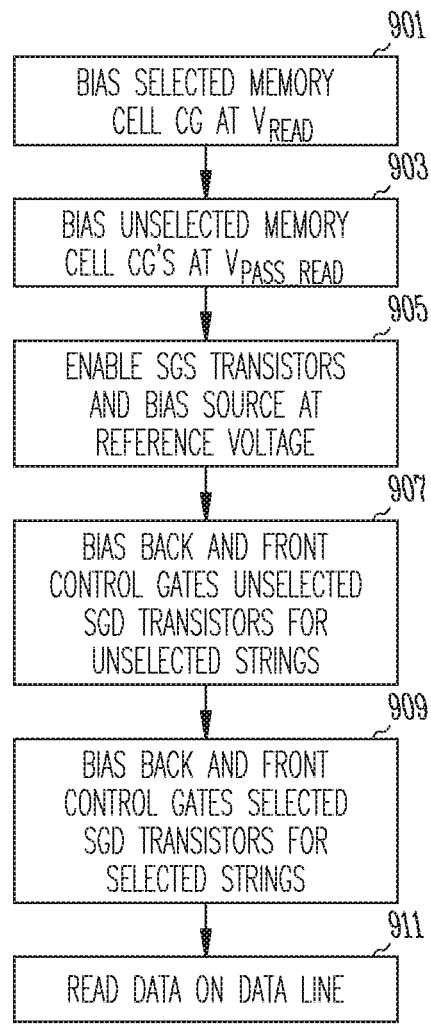
FIG. 9 illustrates a flow chart of an embodiment of a method for reading a memory cell.
Figure 12:
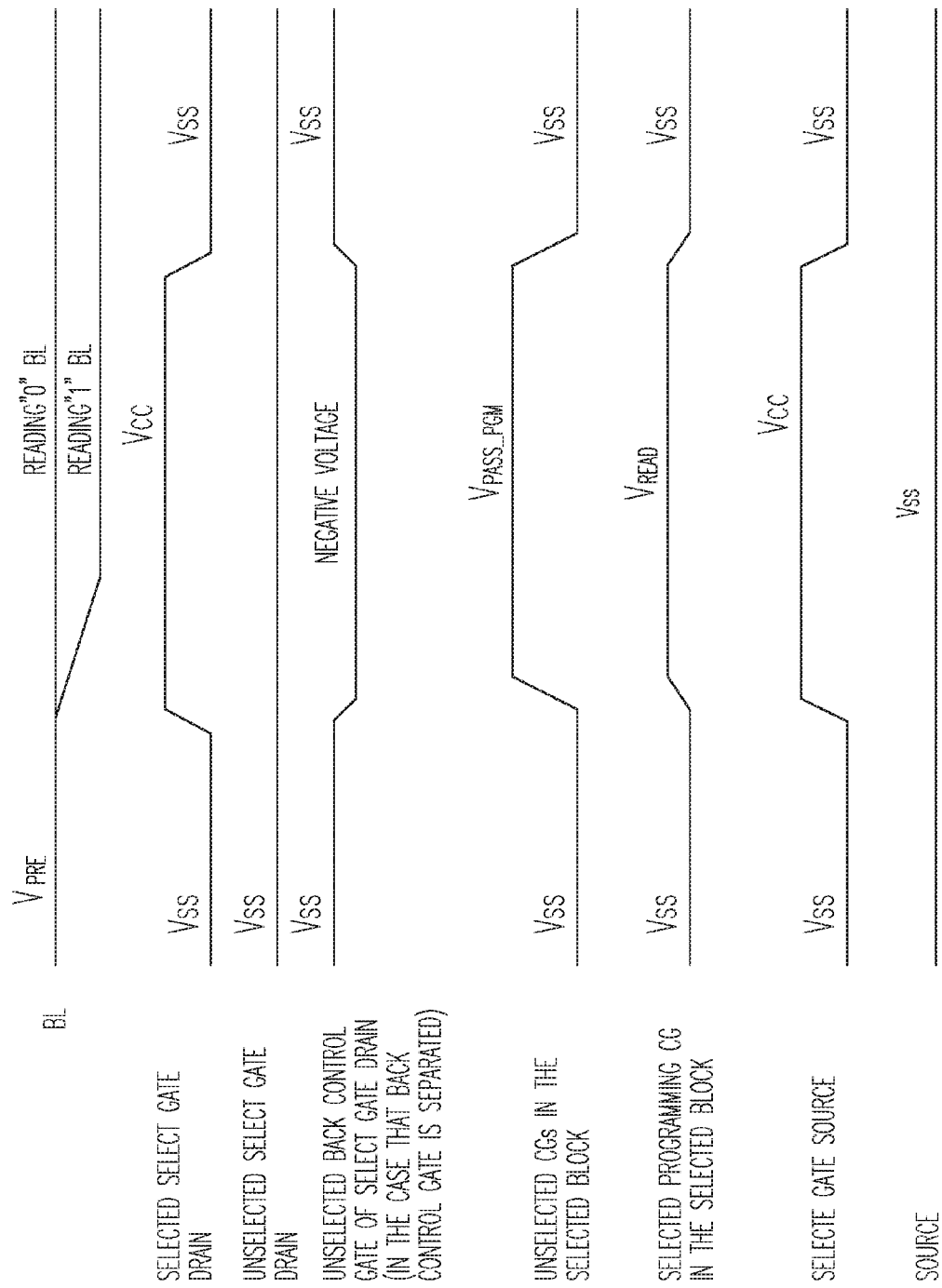
FIG. 12 illustrates a timing diagram of a method for reading the memory cell in accordance with the method of FIG. 9.

FIG. 9 illustrates a flow chart of an embodiment of a method for reading a memory cell. FIG. 12 illustrates a timing diagram of an embodiment of the method for reading the memory cell. FIG. 9 illustrates steps that can be performed during a read operation and, unless particularly noted, does not necessarily illustrate any particular order of steps since FIG. 12 illustrates the actual timing of the signals.

A read operation can be performed by biasing a selected memory cell control gate CG5 (for example) with a read voltage $V_{READ}$ 901 (e.g., 0-6V). The unselected memory cell control gates CG0-CG4 and CG6-CG31 can be biased at a read pass voltage $V_{PASS\_READ}$ 903 (e.g., 5-8V). The SGS transistors can be enabled by biasing their control. gates at an enable voltage (e.g., $V_{CC}$) while the source can be biased at a reference voltage (e.g., (GND, $V_{SS}$) 905.

In an embodiment where the front control gate and the back control gate of the select gate drain transistors are coupled (e.g., shunted), the unselected select gate drain transistor control gates can be biased 907 at a disable voltage (e.g., 0V). The selected select gate drain transistor control gates can be biased 909 at an enable voltage (e.g., $V_{CC}$, 3V).

In an embodiment where the front control gate and the back control gate of the select gate drain transistors are biased separately (e.g., not shunted, not coupled), the front control gate of the unselected select gate drain transistors can be biased at a disable voltage (e.g., 0V) while the back control gate of the unselected select gate drain transistors can be biased at the same disable voltage (e.g., 0V) or some other disable voltage (e.g., a negative voltage) 907. The front control gate of the selected select gate drain transistors can be biased at an enable voltage (e.g., $V_{CC}$) while the back control gate of the selected select gate drain transistors can be biased at the same enable voltage (e.g., $V_{CC}$) or some other enable voltage that is greater than the voltage applied to the front control gate 909. The data from the selected memory cell can then be read on the selected data line 911.

The voltages for the read and program operations are for purposes of illustration only. The present embodiments are not limited to any one voltage or any one range of voltages.

Figure 10:
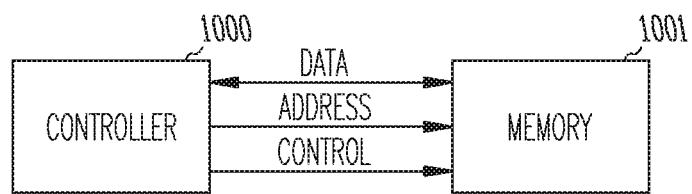
FIG. 10 illustrates a block diagram of an embodiment of a system.

FIG. 10 illustrates an embodiment of a system that may use the 3D memory cell strings with double gated select gate drain transistors of FIGS. 2-6. A controller 1000 may be used to control operations of the system. A memory device 1001, coupled to the controller 1000, may include a memory array comprising the 3D memory cell strings with double gated select gate drain transistors as described above with reference to FIGS. 2-6. In an embodiment, the controller 1000 may be coupled to the memory device 1001 over control, data, and address buses. In another embodiment, the address and data buses may share a common input/output (I/O) bus.

FIGS. 13A and 13B illustrate atop view and a cross-sectional view, respectively, of an embodiment of a double gated select gate transistor that can also be referred to as a double surround gate transistor. The transistor can include a back gate 1301 and a front gate 1305. The back gate 1301 can be substantially surrounded by a body 1309 and separated from a drain 1303 and the body (e.g., lightly doped $N^+$ or P) 1309 by a dielectric material (e.g., $SiO_2$) 1311. The front gate 1305 can substantially surround the body 1309 be separated from the body 1309 by another dielectric material 1312 (e.g., $SiO_2$). A source 1307 can be coupled to the transistor body 1309.

An apparatus may be defined as circuitry, an integrated circuit die, a memory device, a memory array, a transistor, or a system.

CONCLUSION

One or more embodiments of a double gated select gate drain transistor may reduce a drain leakage current between a data line and an unselected select gate drain transistor. The select gate drain transistor with both a front control gate and a back control gate, biased either separately or together, can increase a conductance of unselected select gate drain transistors.

Although specific embodiments have been illustrated and described herein, it will be appreciated by those of ordinary skill in the art that any arrangement that is calculated to achieve the same purpose may be substituted for the specific embodiments shown. Many adaptations will be apparent to those of ordinary skill in the art. Accordingly, this application is intended to cover any adaptations or variations.

What is claimed is:

1. A method comprising:
   biasing a control gate of a selected memory cell with a first voltage;
   biasing control gates of a first group of multiple unselected memory cells with a second voltage;
   biasing a first control gate of a dual gate select drain transistor with a first enable voltage; and
   biasing a second control gate of the dual gate select drain transistor with a second enable voltage, wherein the first control gate of the dual gate select drain transistor extends around at least a portion of the second control gate of the dual gate select drain transistor.

2. The method of claim 1 wherein the first voltage is a read voltage and the second voltage is a read pass voltage.

3. The method of claim 1 wherein the first voltage is a program voltage and the second voltage is a program pass voltage.

4. The method of claim 1 wherein the first enable voltage and the second enable voltage are the same voltage.

5. The method of claim 1 wherein the selected memory cell and the multiple unselected memory cells, are coupled together in a first string of memory cells of a memory device, the first string coupled to the dual gate select drain transistor; the memory device further comprising a second string of memory cells including a second group of multiple memory cells, the second string coupled to a second dual gate select drain transistor, the method further comprising:
biasing a first control gate of the second dual gate select drain transistor with a first disable voltage; and
biasing a second control gate of the unselected second dual gate select drain transistor with a second disable voltage.

6. The method of claim 5 wherein the first disable voltage is greater than the second disable voltage.

7. The method of claim 5, wherein one of the first and second disable voltages comprises a negative voltage.

8. The method of claim 7 wherein the first or the second disable voltage that is not negative is a reference voltage.

9. A method of operating a memory, comprising:
biasing a control gate of a selected memory cell in a first memory cell string with a first voltage, the first memory cell string including a first group of memory cells;
biasing control gates of unselected memory cells in the first memory cell string with a second voltage;
biasing a first control gate of a first dual gate select drain transistor in the first memory cell string with a third voltage; and
biasing a second control gate of the first dual gate select drain transistor in the first memory cell string with a fourth voltage, wherein the first control gate of the first dual gate select drain transistor extends around at least a portion of the second control gate of the first dual gate select drain transistor;
biasing a first control gate of a second dual gate select drain transistor in a second memory cell string with a fifth voltage, the second memory cell string including a second group of memory cells; and
biasing a second control gate of the second dual gate select drain transistor in the second memory cell string with a sixth voltage, wherein the first control gate of the second dual gate select drain transistor extends around at least a portion of the second control gate of the second dual gate select drain transistor.

10. The method of claim 9, wherein the third voltage is a first enable voltage, and wherein the fourth voltage is a second enable voltage.

11. The method of claim 10, wherein the fifth voltage is a first disable voltage, and wherein the sixth voltage is a second disable voltage.

12. The method of claim 9, wherein the first and second memory cell strings each comprise a respective pillar, and wherein in each of the first and second memory cell strings the first control gate of the respective dual gate select drain transistor surrounds a portion of the pillar, and the second control gate of the respective dual gate select drain transistor comprises a portion extending over the pillar, and an extension extending into the pillar.

13. The method of claim 9, wherein the third voltage applied to the first control gate of the first dual gate select drain transistor and the fourth voltage applied to the second control gate of the first dual gate select drain transistor are the same voltage.

14. The method of claim 9, wherein the third voltage applied to the first control gate of the first dual gate select drain transistor and the fourth voltage applied to the second control gate of the first dual gate select drain transistor are different from one another.

15. The method of claim 9, wherein the third voltage applied to the first control gate of the first dual gate select drain transistor and the fourth voltage applied to the second control gate of the first dual gate select drain transistor are different from one another during at least one of a program or read operation.

16. The method of claim 9, wherein the third voltage applied to the first control gate of the first dual gate select drain transistor and the fourth voltage applied to the second control gate of the first dual gate select drain transistor are the same voltage during an erase operation.

\* \* \* \* \*